United States Patent [19]

Leard et al.

[11] Patent Number: 6,120,190
[45] Date of Patent: Sep. 19, 2000

[54] SPATIALLY VARIABLE BANDPASS FILTER MONITORING AND FEEDBACK CONTROL OF LASER WAVELENGTH ESPECIALLY IN WAVELENGTH DIVISION MULTIPLEXING COMMUNICATION SYSTEMS

[75] Inventors: Francis L. Leard, Sudbury; Scott Burroughs, Acton; Ilya Mirman, Lowell, all of Mass.

[73] Assignee: Lasertron, Inc., Bedford, Mass.

[21] Appl. No.: 08/979,204

[22] Filed: Nov. 26, 1997

[51] Int. Cl.[7] ............................. G02B 6/42; H01S 5/0687
[52] U.S. Cl. ................................. 385/88; 372/32
[58] Field of Search ......................... 385/88, 92; 372/32, 372/33, 34, 36, 38; 359/888, 889, 891

[56] References Cited

U.S. PATENT DOCUMENTS

| 4,165,180 | 8/1979 | Failes ........................................ 356/310 |
| 4,796,997 | 1/1989 | Svetkoff et al. ......................... 356/376 |
| 4,807,228 | 2/1989 | Fujiwara et al. ............................. 370/3 |
| 4,815,081 | 3/1989 | Mahlein et al. ........................... 372/32 |
| 4,880,996 | 11/1989 | Peterson et al. ...................... 372/21 X |
| 4,908,829 | 3/1990 | Kruglii et al. ............................ 372/29 |
| 4,923,270 | 5/1990 | Carter .................................. 350/96.18 |
| 4,971,417 | 11/1990 | Krinsky et al. ....................... 350/96.15 |
| 5,173,794 | 12/1992 | Cheung et al. ......................... 359/127 |
| 5,299,212 | 3/1994 | Koch et al. ............................... 372/32 |
| 5,384,799 | 1/1995 | Osterwalder ............................. 372/32 |
| 5,394,489 | 2/1995 | Koch ......................................... 385/14 |
| 5,430,748 | 7/1995 | MacCormack et al. ................. 372/29 |
| 5,457,760 | 10/1995 | Mizrahi .................................... 385/37 |
| 5,600,466 | 2/1997 | Tsushima et al. ...................... 359/124 |
| 5,602,394 | 2/1997 | Dombrowski et al. ............ 250/339.02 |
| 5,646,399 | 7/1997 | Fukushima et al. ................... 250/226 |
| 5,943,349 | 8/1999 | Ohta ........................................ 372/20 |
| 5,956,356 | 9/1999 | Bergmann et al. ...................... 372/32 |
| 5,970,076 | 10/1999 | Hamada ................................... 372/20 |

FOREIGN PATENT DOCUMENTS

| 0 310 000 A2 | 4/1989 | European Pat. Off. ........ H01S 3/106 |
| 0 466 403 A1 | 7/1991 | European Pat. Off. .......... G02B 5/28 |
| 0 762 677 A2 | 3/1997 | European Pat. Off. ...... H04B 10/145 |
| 0 939 470 A2 | 9/1999 | European Pat. Off. ........ H01S 3/133 |
| WO 95/08206 | 3/1995 | WIPO ............................. H01S 3/085 |

OTHER PUBLICATIONS

Rowlands, Scott F. and Swaby, Basil L., "Have you considered using variable bandpass filters?," *Laser Focus World*, (pp. 113–118) Sep. 1989.

Santec Marketing Material of Optical Filters (No date given).

Villeneuve, B., et al., "High–Stability Wavelength–Controlled DFB Laser Sources for Dense WDM Applications", *OFC '98 Technical Digest, Friday Morning*, pp. 381–382. (No Date Given).

*Primary Examiner*—John D. Lee
*Attorney, Agent, or Firm*—Hamilton, Brook, Smith & Reynolds, P.C.

[57] ABSTRACT

A feedback controlled laser diode communication device is disclosed that, as is common, has a laser diode that is modulated in response to an input signal to generate an optical signal, encoding the input signal. Spatially variable passband filter material, however, is arranged to receive at least a portion of the optical signal generated by the laser diode, preferably from the rear facet, and at least one detector is used to detect the thus filtered optical signal. Control circuitry then controls a wavelength of the laser diode based upon the response of the detector(s) to thus provide feedback control. As such, the device is particularly applicable to maintaining the tight channel spacings found in wavelength division multiplexed systems.

35 Claims, 5 Drawing Sheets

SPATIALLY VARIABLE BANDPASS FILTER MONITORING AND FEEDBACK CONTROL OF LASER WAVELENGTH ESPECIALLY IN WAVELENGTH DIVISION MULTIPLEXING COMMUNICATION SYSTEMS

BACKGROUND OF THE INVENTION

In order to increase data throughput without the installation of new fiberoptic links, Wavelength Division Multiplexing (WDM) systems are being deployed. These systems rely on the tunability of semiconductor lasers to access a wider portion of the spectrum that optical fibers propagate. This can result in an increase in data rates by an order of magnitude or more.

Standards have been promulgated for the channel spacings in these WDM systems. The frequency spacings are tight for optical frequencies. For laser diodes operating at around 1.5 micrometers ($\mu$m), it is typically 100 gigahertz (GHz); this translates to an approximately 0.8 nanometers (nm) minimum wavelength channel spacing.

How the laser diodes are tuned to operate in the various channels of the WDM systems depends on the specific types of laser diodes used. The wavelength of distributed feedback (DFB) laser diodes is tuned by changing the temperature of the diodes. Temperature control is typically implemented in the context of laser communication modules with a thermoelectric cooler. These devices extract heat using Peltier effect in a manner that can be electrically modulated. Fabry-Perot lasers are similarly tuned by controlling their temperature. Distributed Bragg (DBR) lasers as tuned by temperature and injection current.

Solutions have been proposed for maintaining the proper channel spacing in these WDM systems. The proposals typically rely on precise factory calibration, due to inherent manufacturing variability in distributed feedback lasers, for example, and manual fine tuning of the WDM module wavelength after installation to detect and adjust for wavelength shifts from aging and environmental effects.

SUMMARY OF THE INVENTION

The present invention concerns wavelength feedback control and/or monitoring for laser diode systems. As such, it is particularly applicable to maintaining the tight channel spacings found in WDM systems. The invention is unique in its reliance on spatially variable filter material to determine or monitor the laser diode's wavelength. This class of light filter provides specific advantages based upon its compact and tunable nature that facilitates the implementation of WDM devices in small well-regulated modules.

In general, according to one aspect, the invention features a feedback controlled laser diode communication device. As is common, the device comprises a laser diode that is modulated in response to an input signal to generate an optical signal, encoding the input signal. Spatially variable filter material, however, is arranged to receive at least a portion of the optical signal generated by the laser diode, and at least one detector is used to detect the thus filtered optical signal. Monitoring and possibly control circuitry then use the response of the detector(s) to thus determine wavelength and potentially provide feedback control.

In a preferred embodiment, the spatially variable filter material has a spatially varying passband. Alternatively, spatially varying low pass or high pass filter material could be substituted.

Also in the preferred embodiment, the spatially variable filter material and at least one detector are arranged to filter and detect light from a rear facet of the laser diode. In this way, the total usable power output of the diode is not reduced, essentially relying on the free rear facet light. In other implementations, however, light from the front facet could be sampled on a partial or periodic basis or during factory calibration.

In a first embodiment, at least two detectors are actually used. This configuration enables the detection of light above and below, respectively, an assigned center wavelength for the device. The control circuitry tunes the wavelength of the laser diode to maintain a predetermined relationship between magnitudes of the responses from the detectors. Moreover, the power output of the laser diode can be modulated or controlled in dependence on the combined responses of the detectors.

This embodiment provides certain ease and flexibility in manufacturing the devices. The placement of the two detectors will determine the response cross-over point in the filter output. The location of the cross-over wavelength is adjusted by moving either detector with respect to the other, such that the response increases and crossover wavelength changes, or both equally with respect to the midpoint, such that the response increases but crossover wavelength is static.

Two detectors, however, are not necessary. In a second embodiment, a single detector is arranged relative to the spatially variable filter material so that its active area changes spatially with the filter. The wavelength is then controlled to maintain a predetermined response from the detector.

In another single detector embodiment, a linear charge coupled device is used. Each element represents a single wavelength bin.

According to another aspect, the invention also features a wavelength-division multiplexed laser diode communication system, which comprises a plurality of channel subsystems. Each subsystem uses the spatially variable filter material in the wavelength feedback control scheme.

In some implementations of the system, the spatially variable filter material is shared between subsystems such that a single spatially variable filter is used for multiple subsystems. Moreover, detector arrays such as charge coupled devices may be used in the control schemes of multiple subsystems.

In general, according to still other aspects, the invention relates to a method for controlling laser diode communication system using spatially variable filter material. Additionally, the material may be used to calibrate wavelength-division multiplexed optical communication systems.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
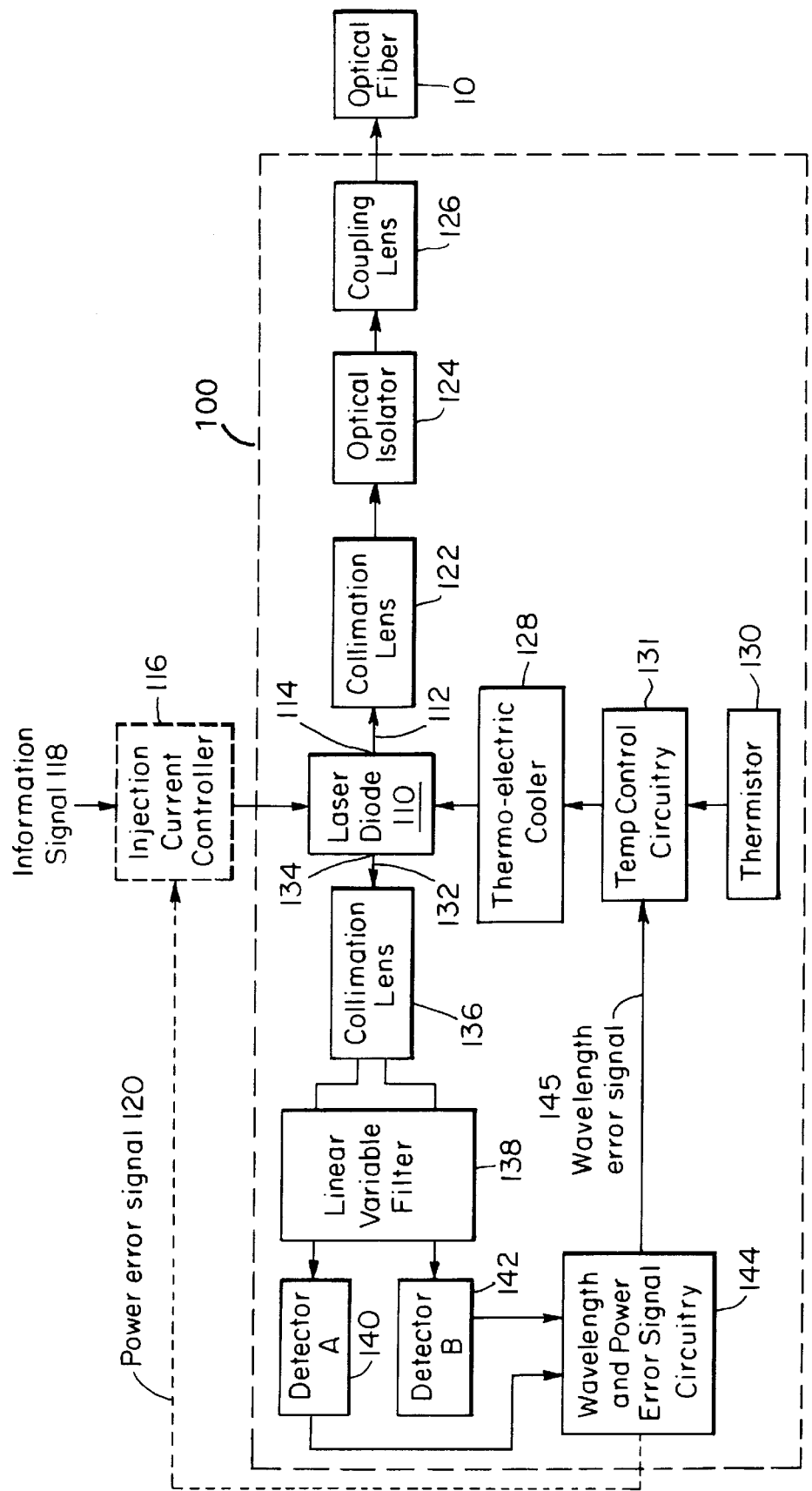
FIG. 1 is a block diagram showing a laser diode communication device according to the present invention.

FIG. 1 is a block diagram of a laser diode communication device 100, which has been constructed according to the principles of the present invention. As is common in these devices, a laser diode 110 generates an optical signal 112 at its front, partially- or non-reflecting facet 114. In one embodiment, the laser diode is a distributed feedback laser that is tunable in a range surrounding 1.5 µm.

Information is encoded into the optical signal 112 by modulating the laser diode's injection current in response to an information signal 118. Specifically, an injection current controller 116, typically external to the communications device 100, receives the information signal 118 and a feedback power error signal 120 from the device 100. The controller 116 modulates the injection current of the laser diode 110 both to encode the information signal and maintain nominal, predetermined output optical powers to conform with both the device's damage thresholds and user design specifications.

The optical signal 112 is transmitted via an optical fiber 10 that is typically external to the communications device 100 or connected as a fiber pigtail. Collimating lens 122 and coupling lens 126 are used to couple the optical signal 112 into the optical fiber for transmission in a typical embodiment. Optical isolator 124, typically comprising two polarizers and an intervening Faraday rotator, is used to provide isolation.

As is also common, the temperature of the laser diode 110 is controlled by a thermo-electric cooler 128. These devices are used to extract heat from or heat the laser diodes to maintain a constant, controlled operating temperature and thus stable wavelength for the optical signal 112. A thermistor 130 is used to detect the temperature of the laser diode 110. It generates a temperature signal that is received by temperature control circuitry 131 that uses both the wavelength error signal and the temperature signal to modulate the operation of the thermo-electric cooler 128 to heat or cool the laser diode. During a power-up interval, the laser diode's wavelength is tunes so that it falls within the capture range of the detector scheme (140, 142). During normal operation, the temperature control circuitry 131 controls the thermo-electric cooler 128 to track the desired wavelength. During this operation, however, the thermistor is monitored to ensure that the temperature does exceed high and/or low temperature thresholds such that the laser diode or other circuitry could be damaged.

According to the present invention, at least a portion 132 of the optical signal is monitored to detect the laser diode's instantaneous wavelength of operation. In the context of the illustrated example, the optical signal is conveniently sampled by detecting light exiting from the rear, reflecting facet 134 of the laser diode 110. In a preferred embodiment, the sampled portion 132 of the optical signal is passed through a collimation lens 136. From there, the sampled light is filtered by a spatially variable filter 138. In the preferred embodiment, the filter 138 is constructed from linearly variable filter material, which has a passband that changes linearly in the x direction across the face of the filter.

In this embodiment, two detectors, detector A 140 and detector B 142, detect the filtered optical signal through two different locations on the filter 138. Indications of the respective filters' responses are provided to wavelength and power error signal circuitry 144. This circuitry generates a wavelength error signal 145 typically based on the difference between the response of detector A 140 and the response of detector B 142 to control the thermo-electric cooler 128 via the temperature control circuitry 131. The circuitry 144 also generates the power error signal 120 that is available to the user external to the device and used by the injection current controller 116. The power error signal 120 is preferably based on the combined responses of the detectors 140, 142.

Figure 2:
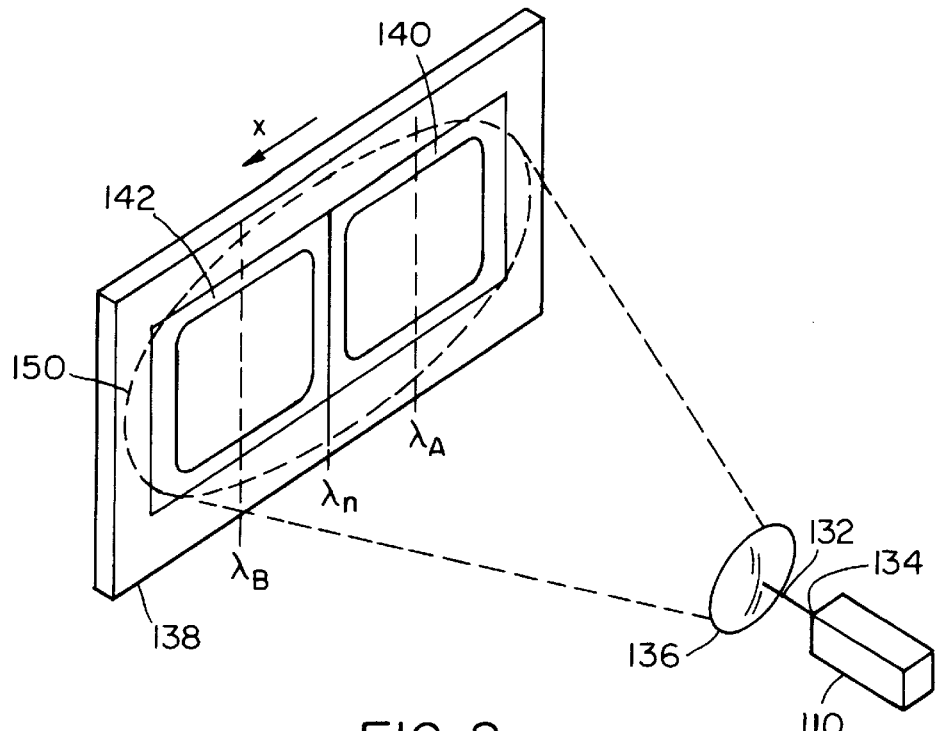
FIG. 2 is a schematic perspective view of the filter and detector arrangement in the inventive communications device.

FIG. 2 shows the arrangement of the spatially variable filter 138 and detectors 140, 142. Specifically, light 132 from the rear facet 134 of the laser diode 110 passes through collimating lens 136 to form a preferably oval illuminated region 150 on a single, unitary piece of spatially variable filter material 138. The detectors 140, 142 are arranged side by side behind the filter 138. In a preferred embodiment, the filter is approximately 500 micrometers long and provides a shift of 0.8 micrometers in wavelength across its face.

Figure 3:
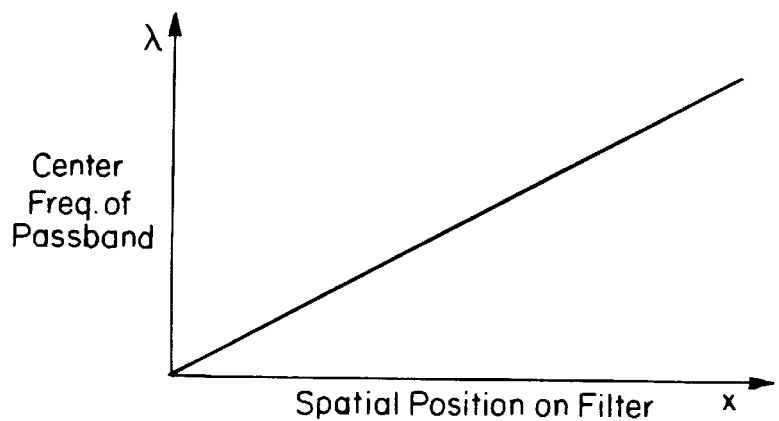
FIG. 3 is a plot of the center frequency passband as a function of spatial filter position for spatially variable filter material.

FIG. 3 is a plot of the center frequency passband as a function of spatial position x on the spatially variable filter material. The center frequency passband for the filter material is dependent on the spatial position on the filter. In the illustrated example, the passband increases in wavelength for increases in the spatial position across the filter.

Figure 4:
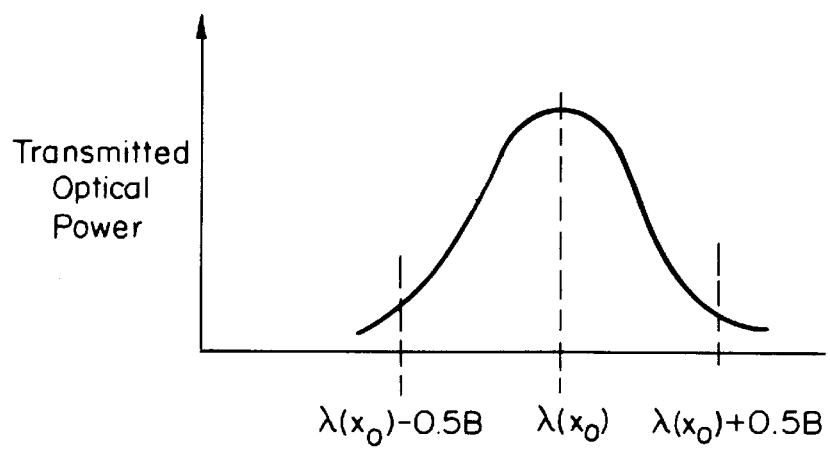
FIG. 4 is a plot of transmitted optical power as a function of wavelength for the spatially variable filter material at an arbitrary position $X_0$.

FIG. 4 illustrates an exemplary passband, plotting transmitted optical power as a function of wavelength. At a given position on the filter material $X_0$, there is a unique center frequency for the filter material's passband, $\lambda(X_0)$. The filter material also has a defined passband (B) that is relatively constant. This passband defines the transmitted wavelengths of light at a given location in the filter material. Specifically, substantially only light between $\lambda(X_0)-0.5$ B to $\lambda(X_0)+0.5$ B is transmitted at spatial location $X_0$.

Figure 5:
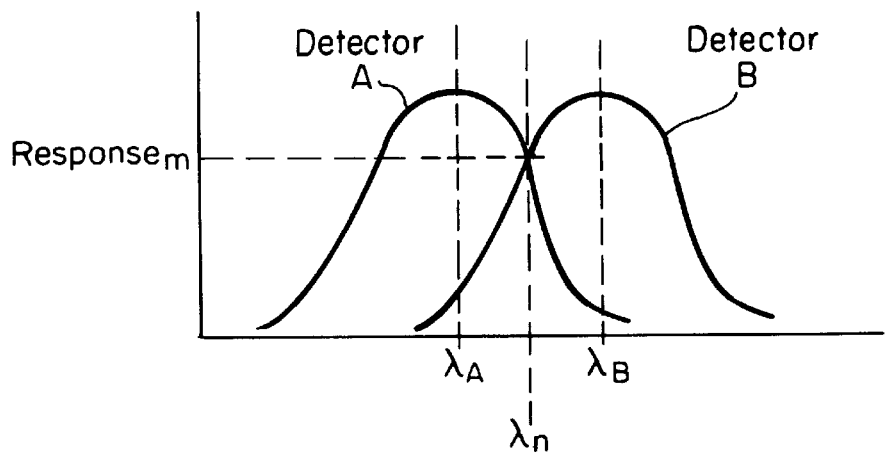
FIG. 5 is a plot of the detectors' responses as a function of the optical signal from the laser diode.

FIG. 5 shows the spectrums to which detector A 140 and detector B 142 are responsive due to their placement with respect to the filter material 138. Specifically, detector A 140 is located in front of the spatially variable filter material 138 such that it has a passband centered around wavelength $\lambda_A$. Detector B 142 is located in front of a different portion of the filter material 138 and thus has a passband to which it is responsive centered around the wavelength $\lambda_B$. In the control scheme of the preferred embodiment, the assigned wavelength of the communications device 100 is $\lambda_n$, which, in one specific implementation, is halfway between $\lambda_B$ and $\lambda_A$. As a result, the wavelength and power error circuitry 144 generates a wavelength error signal to control the thermoelectric cooler 128 to balance the responses of the detectors 140, 142, thus providing feedback control to maintain the laser diode's wavelength at $\lambda_n$.

The configuration of this embodiment provides particular ease and flexibility of manufacturing. The placements of the two detectors will determine the response cross-over point in the filter output. Both the response (intensity m at crossover) and location of the cross-over wavelength $\lambda_n$ can be adjusted by moving either detector with respect to the other. This changes the response intensity and $\lambda_n$. Alternatively, the locations of both detectors can be moved equally with respect to the midpoint. The response increases or decreased depending on whether the detectors were moved towards or away from each other, respectively, but $\lambda_n$ is static. In a related vein, moving the filter material 138 with respect to the detector pair, changes $\lambda_A$, $\lambda_n$, $\lambda_B$, to accommodate different assigned wavelengths without compromising the relationships in sensitivity afforded by the original detector set up.

Figure 6:
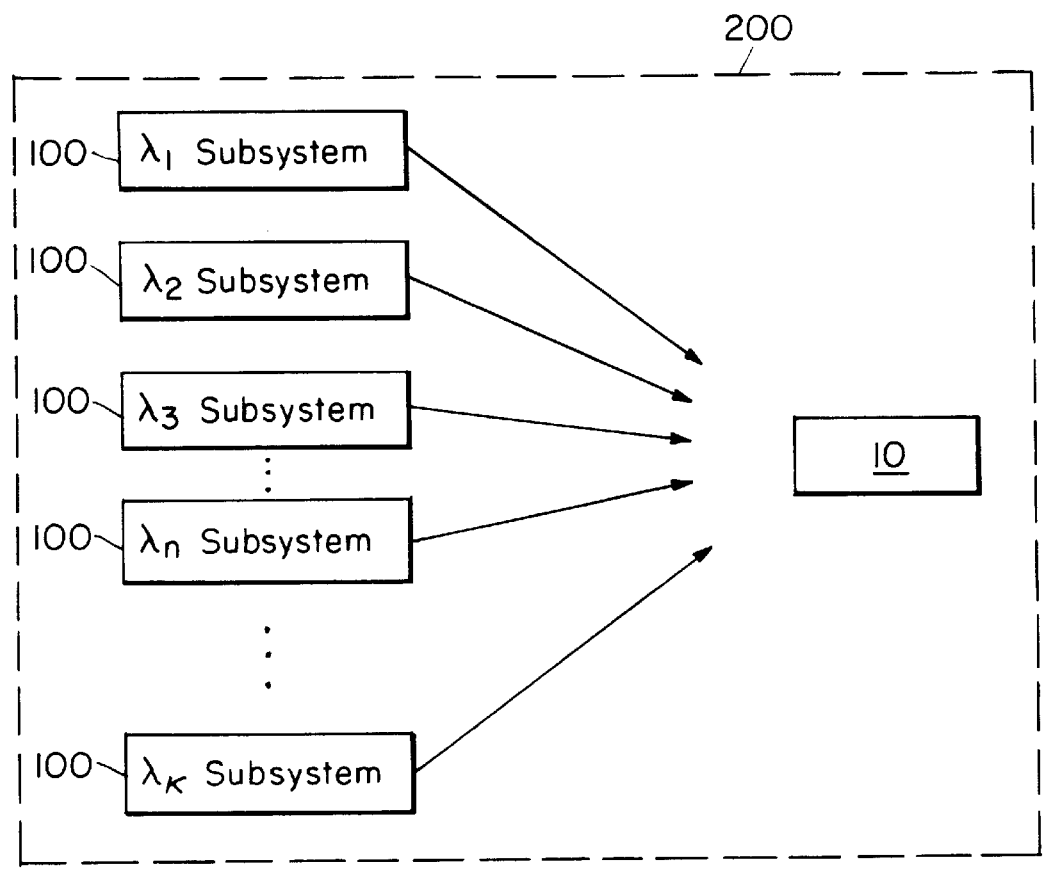
FIG. 6 is a block diagram illustrating the implementation of the inventive laser diode communication devices as channel subsystems in a wavelength division multiplexed laser diode communication system.

FIG. 6 shows an implementation of the communication device 100 as channel subsystems in a wavelength division multiplex module 200. In such a system, the laser diode of each subsystem is controlled to operate at a different wavelength $\lambda_j$–$\lambda_k$ within the tunability of the laser diode technology. For example, one proposed system, the laser diodes nominal center frequencies stretch from 195.9 to 191.7 TeraHertz (THz), with minimum channel spacings of 100 gigahertz. The corresponding wavelengths centers stretch from 1530.33 to 1563.86 nm, with an approximately 0.8 nanometer spacing. In such systems, tens to hundreds of separate channels are conveyed in the same single mode optical fiber 10, yielding vast increases in the total data transmission rates of the fiber relative to non-multiplexed systems.

When the devices are implemented together in a module 200 certain components may be shared between subsystems 100. For example, the discrete detectors 140, 142 in each subsystem are replaced with detector arrays or charged coupled device (CCD) arrays in some implementations to reduce the cost of the module. Further, a single strip of filter material is used for the entire module. Each of the specific subsystems accesses only a portion of the strip. Additionally, the wavelength error signal circuitry may be distributed between subsystems as separately functioning circuits or unified control of all subsystems may be provided with shared analog/digital controller circuitry.

Figure 7:
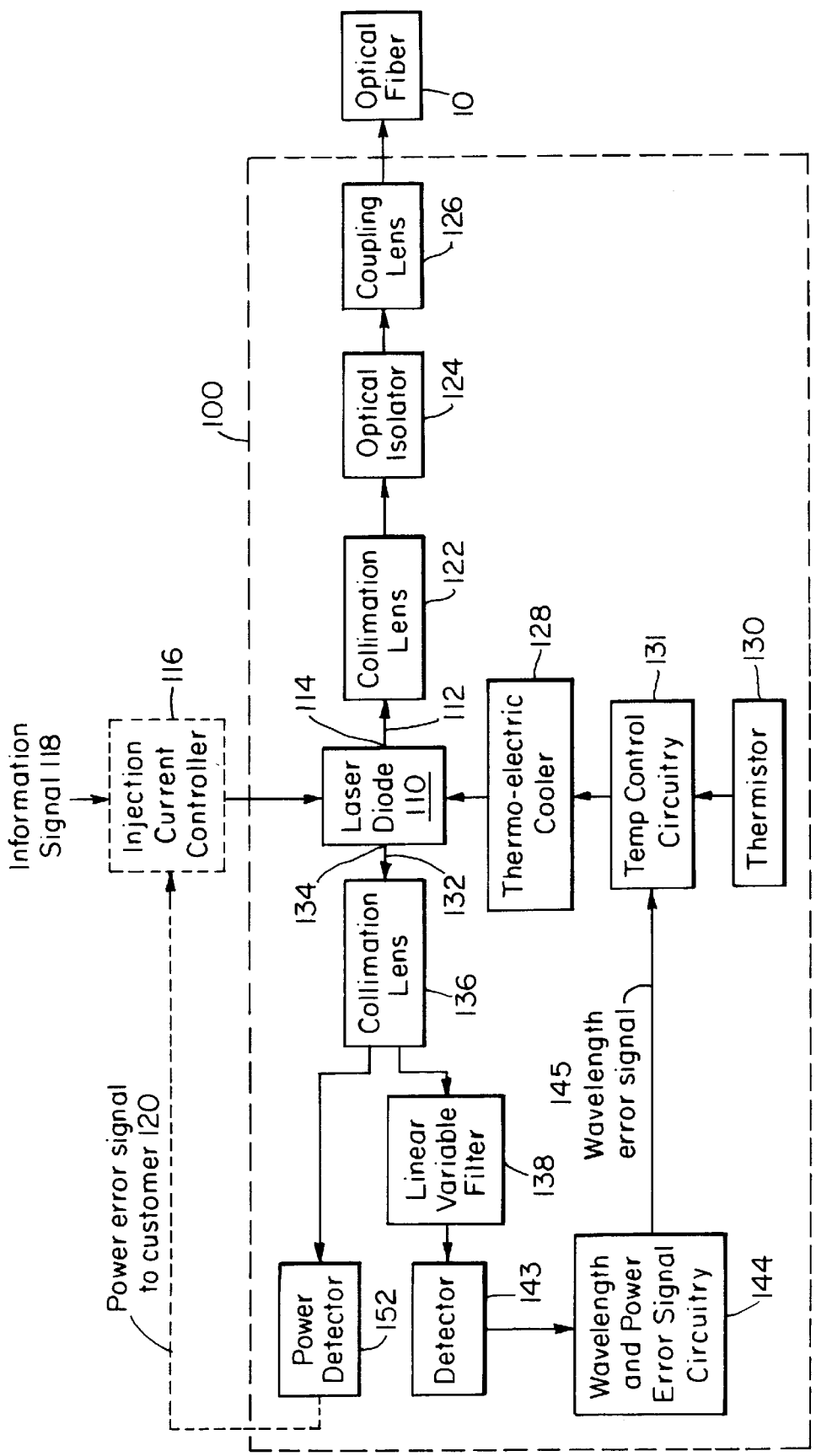
FIG. 7 is a block diagram of a laser diode communication device according to a second embodiment of the invention.

FIG. 7 is a block diagram of a second embodiment of the laser diode communication device. This embodiment differs insofar as it uses a single detector 143. This detector 143 is arranged relative to the variable filter 138 such that the magnitude of its response varies with the varying wavelength from the sampled optical signal 132.

Figure 8:
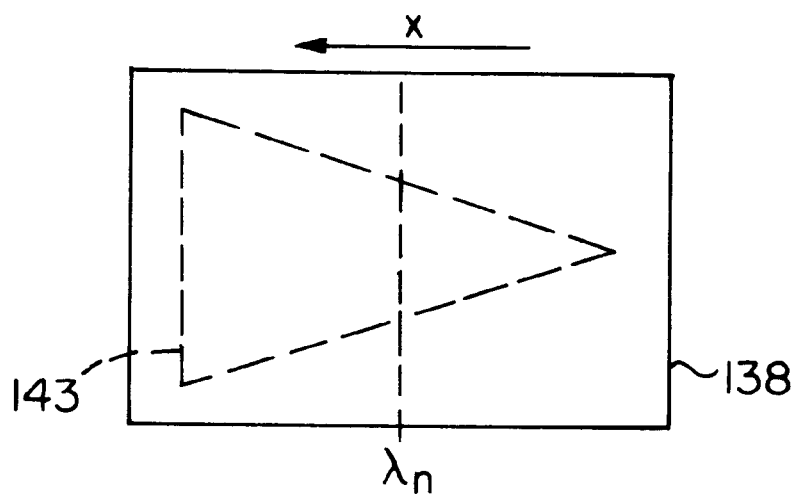
FIG. 8 is a plan view of the arrangement between the detector and spatially variable filter material in the second embodiment of the communications device.

FIG. 8 is a block diagram of the detector 143 and spatially variable filter 138. The detector 143, or stop for the detector, is shaped in the direction of the filter's spatial variability to provide wavelength dependent operation. For example, if the wavelength of the laser diode 110 were to increase, the transmissive portion of the filter material 138 shifts in the positive x direction. In the positive x direction, the active area of filter 143 increases so that it is more responsive for a given wavelength. As a result, the wavelength error signal circuitry 145 modulates the thermo-electric cooler 128 such that the detector's response is held at a predetermined level. In the illustrated example, the circuitry 145 modulates the diode's temperature to track a wavelength of $\lambda_n$.

Returning to FIG. 7, since the detector 143 can not easily be used for power control, a separate power controller 152 to required to generate the power error signal 120.

In other embodiments, the CCD-type detectors are used. These, preferably linear-type, CCD elements are arranged to extend in the direction of the variability in the spatially variable filter material. Each element of CCD represents a separate wavelength bin. The wavelength of the laser diode is then controlled to maintain a predetermined relationship in the intensity signals detected in each of the bins.

Although the invention has been described for use in combination with distributed feedback lasers, it is broadly applicable to other types of laser diode devices or other wavelength tunable lasers. For example, temperature controlled laser devices such as Fabry-Perot lasers and distributed Bragg reflector lasers could also be used. Further, external cavity lasers that are wavelength tuned by adjusting an intra-cavity grating is another alternative. In such an implementation, the wavelength error signal is used to control an actuating element, e.g., piezo-electric device, that physically rotates the grating to tune wavelength.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A feedback controlled laser diode communication device, comprising:
    a laser diode that is modulated in response to an input signal to generate an optical signal;
    spatially variable filter material arranged to receive at least a portion of the optical signal generated by the laser diode;
    at least one detector that detects a portion of the optical signal that is received and filtered by the spatially variable filter material; and
    control circuitry that uses a response of at least one detector to control the wavelength of the laser diode.

2. A laser diode communication device as described in claim 1, wherein the spatially variable filter material has a spatially varying passband.

3. A laser diode communication device as described in claim 1, wherein the spatially variable filter material and the at least one detector are arranged to filter and detect light from a rear facet of the laser diode.

4. A laser diode communication device as described in claim 1, further comprising at least two detectors that are arranged relative to the spatially variable filter material to detect light above and below, respectively, an assigned center wavelength for the device.

5. A laser diode communication device as described in claim 4, wherein the control circuitry tunes the wavelength of the laser diode to maintain a predetermined relationship between magnitudes of the responses from the detectors.

6. A laser diode communication device as described in claim 4, wherein a power output of the laser diode is modulated in dependence on combined responses of the detectors.

7. A laser diode communication device as described in claim 1, wherein the detector is arranged relative to the spatially variable filter material so that its active area changes spatially with the filter.

8. A laser diode communication device as described in claim 1, wherein the device is installed within a module.

9. A laser diode communication device as described in claim 1, wherein the wavelength of the laser diode is controlled by controlling the temperature of the laser diode.

10. A laser diode communication device as described in claim 1, wherein the wavelength of the laser diode is controlled by controlling an intra-cavity grating of the laser diode.

11. A laser diode communication device as described in claim 1, wherein the detector comprises a linear charge-coupled device.

12. A laser diode communication device as described in claim 1, wherein the spatially variable filter material has a spatially, linearly varying passband.

13. A laser diode communication device as described in claim 1, wherein the spatially variable filter material has a spatially, continuously varying passband.

14. A laser diode wavelength monitoring system, comprising:
a laser diode that generates a light beam;
spatially variable filter material arranged to receive at least a portion of the light beam generated by the laser diode;
detector that detects a portion of the light beam that is received and filtered by the spatially variable filter material; and
wavelength detection circuitry that uses a response of the detector to monitor the wavelength of the laser diode.

15. A wavelength-division multiplexed laser diode communication system, comprising:
a plurality of channel subsystems, each subsystem comprising:
a laser diode that is modulated in response to an input signal to generate an optical signal,
spatially variable filter material arranged to receive at least a portion of the optical signal generated by the laser diode, and
at least one detector that detects a portion of the optical signal that is received and transmitted by the spatially variable filter; and
control circuitry that uses responses of the detectors in the subsystems to control wavelengths of the optical signals of the laser diodes.

16. A laser diode communication system as described in claim 15, wherein the optical signals from the subsystems are coupled into a single optical fiber.

17. A laser diode communication system as described in claim 15, wherein the spatially variable filter material associated with at least one of the channel subsystems has a spatially varying passband.

18. A laser diode communication system as described in claim 15, wherein the spatially variable filter material and the at least one detector of each of the channel subsystems are arranged to filter and detect light from rear facets of the laser diodes.

19. A laser diode communication system as described in claim 15, wherein the spatially variable filter material is shared between subsystems.

20. A laser diode communication system as described in claim 15, wherein a single spatially variable filter is shared between multiple channel subsystems.

21. A laser diode communication system as described in claim 15, further comprising at least two detectors that are arranged relative to the spatially variable filter material to detect light above and below, respectively, an assigned center wavelength for the subsystem.

22. A laser diode communication system as described in claim 21, wherein the control circuitry tunes the wavelengths of the laser diodes to maintain predetermined relationships between magnitudes of the responses from the detectors for the respective diodes.

23. A laser diode communication system as described in claim 21, wherein power outputs of the laser diodes of the subsystems are modulated in dependence on combined responses of the detectors of the subsystems.

24. A laser diode communication system as described in claim 15, wherein the detectors of the subsystems are arranged relative to the spatially variable filter material so that active areas change spatially with the filters.

25. A laser diode communication system as described in claim 15, wherein the spatially variable filter material of the channel subsystems has a spatially, linearly varying passband.

26. A laser diode communication system as described in claim 15, wherein the spatially variable filter material of the channel subsystems has a spatially, continuously varying passband.

27. A method for controlling a laser diode communication system, comprising:
modulating a laser diode in response to an input signal to generate an optical signal;
filtering at least a portion of the optical signal generated by the laser diode with spatially variable filter material;
detecting the filtered optical signal; and
controlling a wavelength of the laser diode in response to the filtered optical signal.

28. A method as described in claim 27, further comprising arranging the spatially variable filter material to filter the optical signal from a rear facet of the laser diode.

29. A method as described in claim 27, further comprising filtering the optical signal at two passbands one above and one below an assigned center wavelength for the system.

30. A method as described in claim 29, further comprising modulating a power output of the laser diode in dependence on combined responses at the two passbands.

31. A method as described in claim 27, further comprising arranging the spatially variable filter material having a linearly varying passband.

32. A method as described in claim 27, further comprising arranging the spatially variable filter material having a spatially continuously varying passband.

33. A method for monitoring wavelength of a laser system, comprising:
generating a beam by modulating a laser;
filtering at least a portion of the beam generated by the laser with spatially variable filter material;
detecting the filtered beam; and
monitoring a wavelength of the laser in response to the filtered beam.

34. A process for calibrating a wavelength-division multiplexed optical communication system, the process comprising:

installing a plurality of channel subsystems in a module for the system, the channel subsystems producing modulated optical signals at different wavelengths;

filtering at least a portion of the optical signals generated by the channel subsystems with spatially variable filter material; and calibrating the respective wavelengths of the channel subsystems in response to the filtered optical signals.

35. A process for calibrating a channel subsystem in a wavelength-division multiplexed optical communication system, the process comprising:

filtering at least a portion of the optical signals generated by a laser diode with spatially variable filter material; and tuning the channel subsystem by moving the spatially variable filter material relative to the laser diode; and fixing the filter material when desired operating wavelength of the laser diode is achieved.

* * * * *